(12) United States Patent
Najafi et al.

(10) Patent No.: US 7,098,117 B2
(45) Date of Patent: Aug. 29, 2006

(54) METHOD OF FABRICATING A PACKAGE WITH SUBSTANTIALLY VERTICAL FEEDTHROUGHS FOR MICROMACHINED OR MEMS DEVICES

(75) Inventors: Khalil Najafi, Ann Arbor, MI (US); Joseph M. Giachino, South Lyon, MI (US); Junseok Chae, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 10/688,417

(22) Filed: Oct. 17, 2003

(65) Prior Publication Data

US 2004/0152229 A1    Aug. 5, 2004

Related U.S. Application Data

(60) Provisional application No. 60/419,446, filed on Oct. 18, 2002.

(51) Int. Cl.
*H01L 21/46* (2006.01)
(52) U.S. Cl. .................................... 438/456; 438/459
(58) Field of Classification Search ...................... None
See application file for complete search history.

(56) References Cited

U.S. PATENT DOCUMENTS

| 4,261,086 | A | 4/1981 | Giachino et al. |
| 4,277,814 | A | 7/1981 | Giachino et al. |
| 4,386,453 | A | 6/1983 | Giachino et al. |
| 4,815,472 | A | 3/1989 | Wise et al. |
| 5,377,524 | A | 1/1995 | Wise et al. |
| 5,837,562 | A | 11/1998 | Cho |
| 6,225,145 | B1 * | 5/2001 | Choi et al. .................. 438/120 |
| 6,338,284 | B1 | 1/2002 | Najafi et al. |
| 6,384,353 | B1 * | 5/2002 | Huang et al. ................ 200/181 |
| 6,512,300 | B1 * | 1/2003 | Cheever et al. .............. 257/777 |
| 6,633,079 | B1 * | 10/2003 | Cheever et al. .............. 257/723 |
| 6,806,557 | B1 * | 10/2004 | Ding ........................... 257/659 |
| 6,809,412 | B1 * | 10/2004 | Tourino et al. .............. 257/678 |
| 6,815,739 | B1 * | 11/2004 | Huff et al. ................... 257/275 |
| 6,878,566 | B1 * | 4/2005 | Caplet .......................... 438/52 |
| 6,894,358 | B1 * | 5/2005 | Leib et al. ................... 257/414 |
| 6,969,630 | B1 * | 11/2005 | Ozgur ........................... 438/53 |
| 2004/0027218 | A1 * | 2/2004 | Stafford et al. ............... 335/78 |

FOREIGN PATENT DOCUMENTS

| EP | 024945 A2 * | 9/1980 |
| EP | 1 228 998 A | 8/2002 |

* cited by examiner

*Primary Examiner*—Alonzo Chambliss
(74) *Attorney, Agent, or Firm*—Brooks Kushman P.C.

(57) ABSTRACT

A vacuum or hermetic packaged micromachined or MEMS device and methods for manufacturing the device so that the device has at least one substantially vertical feedthrough are provided. In a first embodiment, the method includes: providing a MEMS device fabricated on a first side of a substrate and located within a vacuum or hermetic cavity; forming at least one hole completely through the substrate between first and second sides of the substrate after the step of providing; and forming a path of electrically conductive material connecting the MEMS device and the second side of the substrate through the at least one hole to form the at least one substantially vertical feedthrough.

39 Claims, 3 Drawing Sheets

METHOD OF FABRICATING A PACKAGE WITH SUBSTANTIALLY VERTICAL FEEDTHROUGHS FOR MICROMACHINED OR MEMS DEVICES

CROSS-REFERENCE TO RELATED APPLICATION

This application claims the benefit of U.S. provisional application Ser. No. 60/419,446, filed Oct. 18, 2002.

BACKGROUND OF THE INVENTION

1. Field of the Invention

This invention relates to manufacturing methods and vacuum or hermetically packaged micromachined or MEMS devices formed thereby having substantially vertical feedthroughs.

2. Background Art

Low-cost vacuum packaging of MEMS has become one of the most important challenges in the MEMS industry for a number of emerging applications including resonant sensors and RF MEMS. Many different packaging technologies have been developed over the years, including hermetic and vacuum packaging of MEMS. There are many requirements for a MEMS package. These include small size, vacuum/hermetic capability, integrated sealed feedthroughs, wafer level processing, compatibility with most MEMS processes, reliability, stability in the face of exposure to harsh environmental conditions such as temperature/humidity/vibration, and of course, above all, low cost. Unfortunately for the MEMS manufacturer, most of these requirements have to be satisfied at the same time. A package that cannot be fabricated at low cost, or is too large, or cannot provide feedthroughs, will not find many applications. This is where the challenge lies to further advance the field of MEMS sensors and Microsystems.

Many technologies have been developed for MEMS over the past few decades. One of these technologies is the so-called dissolved-wafer process (DWP) as described in U.S. Pat. Nos. 4,815,472 and 5,377,524. The process forms heavily boron-doped silicon microstructures on a glass substrate. Electrical connections are made to the silicon microstructures using metal lines deposited on the glass substrate. This process has been used to produce many different types of sensors, actuators, and Microsystems, and has been specifically used to manufacture one of the highest performance gyroscopes for inertial applications developed originally by Draper Lab. An important requirement for the successful operation of the gyroscope is that it should be operated in vacuum for many years. Therefore, a stable vacuum packaging technology is needed for this device.

S. Cho developed a vacuum package for this device based on bonding a glass capsule to the device glass substrate using an intermediate layer of high resistivity polysilicon as described in U.S. Pat. No. 5,837,562. Feedthroughs were formed from gold lines. During the bonding process, these gold lines interdiffused with the high resistivity polysilicon through a eutectic process to form sealed feedthroughs. The eutectic was able to reflow and therefore cover over the steps created by the gold lines. Although some data for the vacuum capability of this package was presented, no long term data has been presented. The electrical connections for this packaging approach were brought out as gold lines on the device glass substrate. Bonding pads were brought out to the edge of the chip and could be used for wire bonding. The fact that bonding pads were used on the same side as the device meant that additional die area was used. In addition, it was not easy to flip chip attach this die to a circuit board.

The following U.S. patents relate to semiconductor variable capacitance pressure transducers and methods of making same wherein one of the named inventors is also a co-inventor of at least one of the inventions described and claimed herein: U.S. Pat. Nos. 4,261,086; 4,277,814; and 4,386,453.

SUMMARY OF THE INVENTION

An object of the present invention is to provide a low-cost manufacturing method and vacuum or hermetically packaged micromachined or MEMS device formed thereby having at least one substantially vertical feedthrough wherein a minimum amount of die area is used.

In carrying out the above object and other objects of the present invention, a method for manufacturing a vacuum or hermetically packaged micromachined or MEMS device having at least one substantially vertical feedthrough is provided. The method includes: providing a micromachined or MEMS device fabricated on a first side of a substrate and located within a vacuum or hermetic cavity; forming at least one hole completely through the substrate between first and second sides of the substrate after the step of providing; and forming a path of electrically conductive material connecting the micromachined or MEMS device and the second side of the substrate through the at least one hole to form the at least one substantially vertical feedthrough.

The substrate may be a glass substrate.

The vacuum or hermetic cavity may at least partially be defined by a capsule connected to the substrate at a bonding area.

The micromachined or MEMS device may include at least one microstructure.

The at least one microstructure may include a doped-semiconductor or metal microstructure.

The method of manufacturing may further include forming a plurality of electrical leads on the first side of the substrate in communication with the micromachined or MEMS device.

The step of providing may include the step of bonding a capsule to the substrate to form the vacuum or hermetic cavity and wherein the step of forming may include the step of partially forming the at least one hole from the first side before the step of bonding.

The step of forming the at least one hole may include the step of etching the substrate at the second side of the substrate.

The step of forming the path may include the step of depositing a layer of electrically conductive material on the second side of the substrate and in the at least one hole.

The method may further include placing a solder ball or paste in the at least one hole on the layer of electrically conductive material.

The method may further include bonding a wire to the layer of electrically conductive material.

The layer may be deposited in the bonding area on the second side and wherein the method may further include placing a solder ball or paste on the layer of electrically conductive material at the bonding area.

The method may further include removing material from the second side of the substrate to thin the substrate before the step of forming the at least one hole.

The capsule may be anodically bonded or eutectically or solder bonded at the bonding area.

Further, in carrying out the above object and other objects of the present invention, a method for manufacturing a vacuum or hermetically packaged micromachined or MEMS device is provided. The method includes: providing a wafer and a substrate having first and second sides; partially forming at least one hole in the first side of the substrate; bonding the wafer to the substrate to obtain a device substrate after the step of partially forming; fabricating a micromachined or MEMS device from the wafer after the step of bonding; positioning a capsule having a concave surface on the device substrate over the micromachined or MEMS device; bonding the capsule to the device substrate to form a vacuum or hermetic cavity enclosing the micromachined or MEMS device and to form a bonding area which provides a hermetic seal around the vacuum or hermetic cavity; thinning the substrate down; finish forming at least one hole completely through the substrate between the first and second sides after the step of thinning; and forming a path of electrically conductive material connecting the micromachined or MEMS device and the second side of the substrate through the at least one hole.

The substrate may be a glass substrate.

The capsule may be a silicon or glass capsule.

The micromachined or MEMS device may include at least one microstructure.

The at least one microstructure may include a doped-semiconductor or metal microstructure.

The method may include the step of forming a plurality of electrical leads on the first side of the substrate in communication with the micromachined or MEMS device.

The step of partially forming the at least one hole may include the step of removing material from the substrate to form at least one recess in the first side of the substrate before the step of bonding the wafer to the substrate.

The step of thinning may include the step of etching the substrate at the second side of the substrate after the step of bonding the capsule to the device substrate.

The step of forming the path may include the step of depositing a layer of electrically conductive material on the second side of the substrate and in the at least one hole.

The method may further include placing a solder ball or paste that could be heated to form a solder ball in the at least one hole on the layer of electrically conductive material.

The method may further include bonding a wire to the layer of electrically conductive material.

The method may further include depositing the layer at the bonding area on the second side and wherein the method may still further include placing a solder ball or paste on the layer of electrically conductive material at the bonding area.

The step of thinning may include removing material from the second side of the substrate to thin the substrate after the step of bonding the capsule to the device substrate and before the step of finish forming the at least one hole is completed.

The step of bonding the capsule to the device substrate may include the step of anodically bonding the capsule to the substrate.

The step of bonding the capsule to the device substrate may include the step of eutectically or solder bonding the capsule to a peripheral portion of the semiconductor device to minimize outgasing into the vacuum or hermetic cavity.

Further in carrying out the above object and other objects of the present invention, a vacuum or hermetic packaged micromachined or MEMS device which is manufactured in accordance with at least some of the above steps is provided.

The above object and other objects, features, and advantages of the present invention are readily apparent from the following detailed description of the best mode for carrying out the invention when taken in connection with the accompanying drawings.

DETAILED DESCRIPTION OF THE PREFERRED EMBODIMENT(S)

Figure 1:
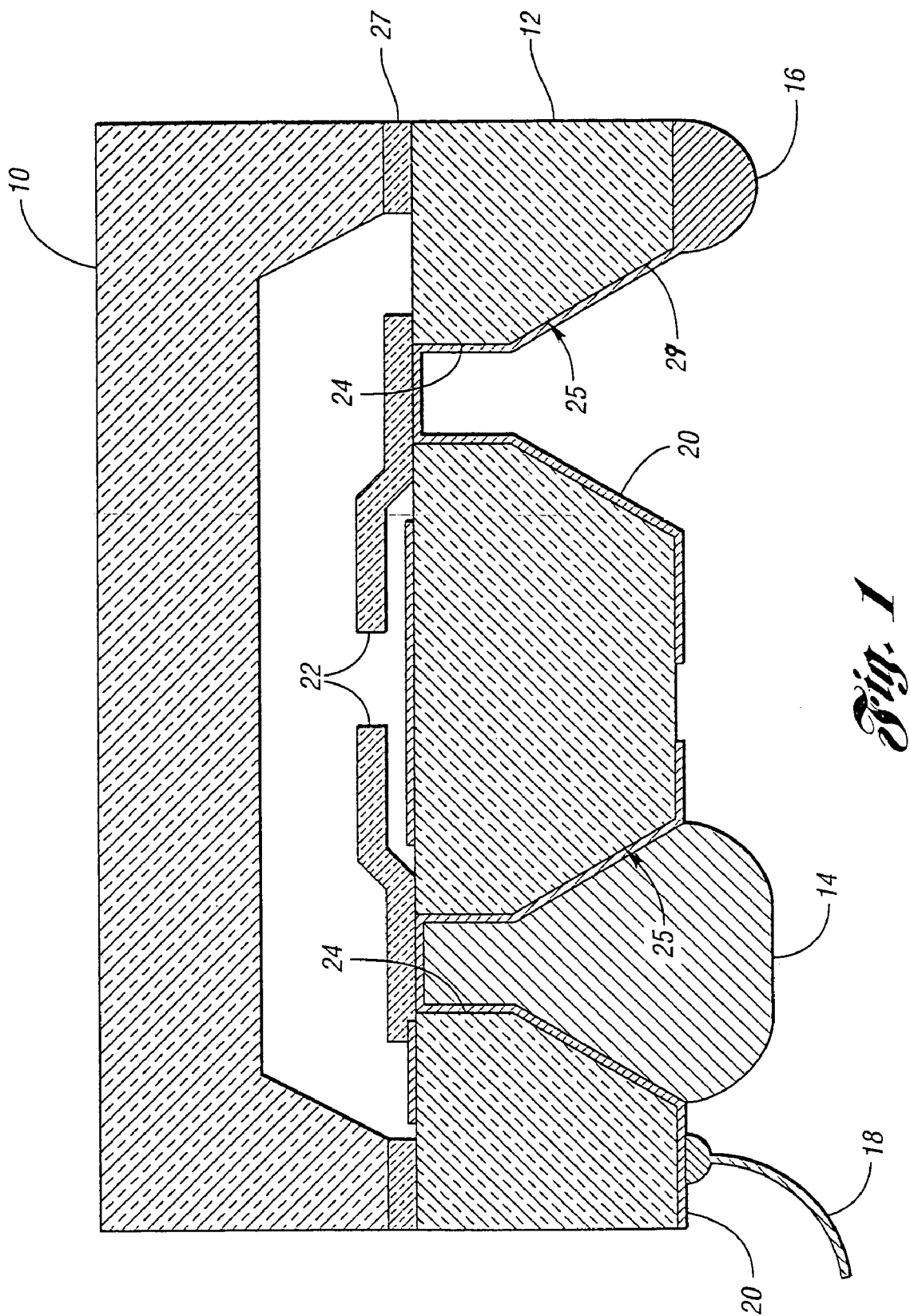
FIG. 1 is a cross-sectional view of a vacuum packaged semiconductor device manufactured in accordance with one embodiment of a method of the present invention including substantially vertical feedthroughs developed for MEMS fabricated using a dissolved wafer process.
Figure 2:
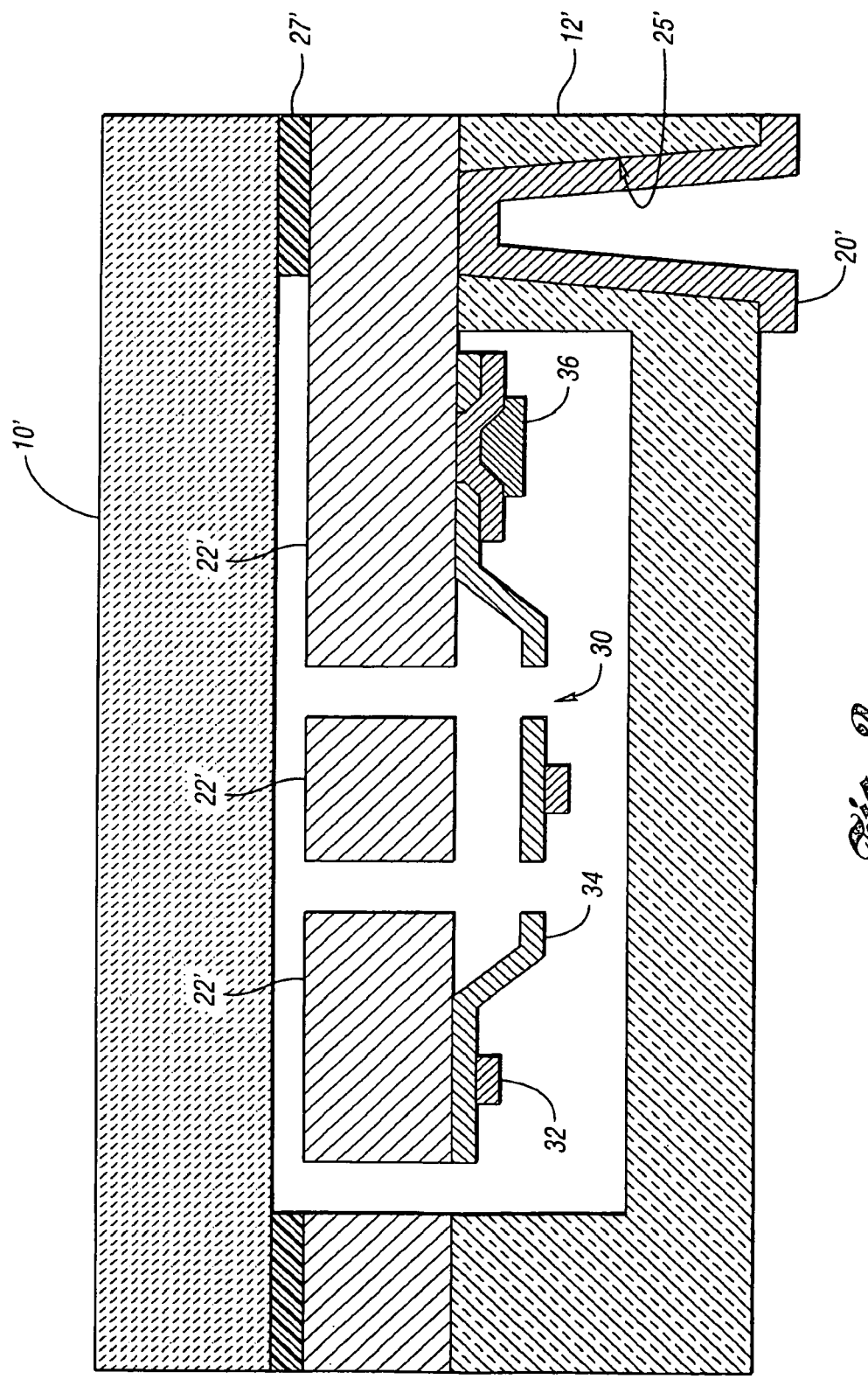
FIG. 2 is a cross-sectional view of a vacuum packaged semiconductor device manufactured in accordance with a second embodiment of the method.
Figure 3:
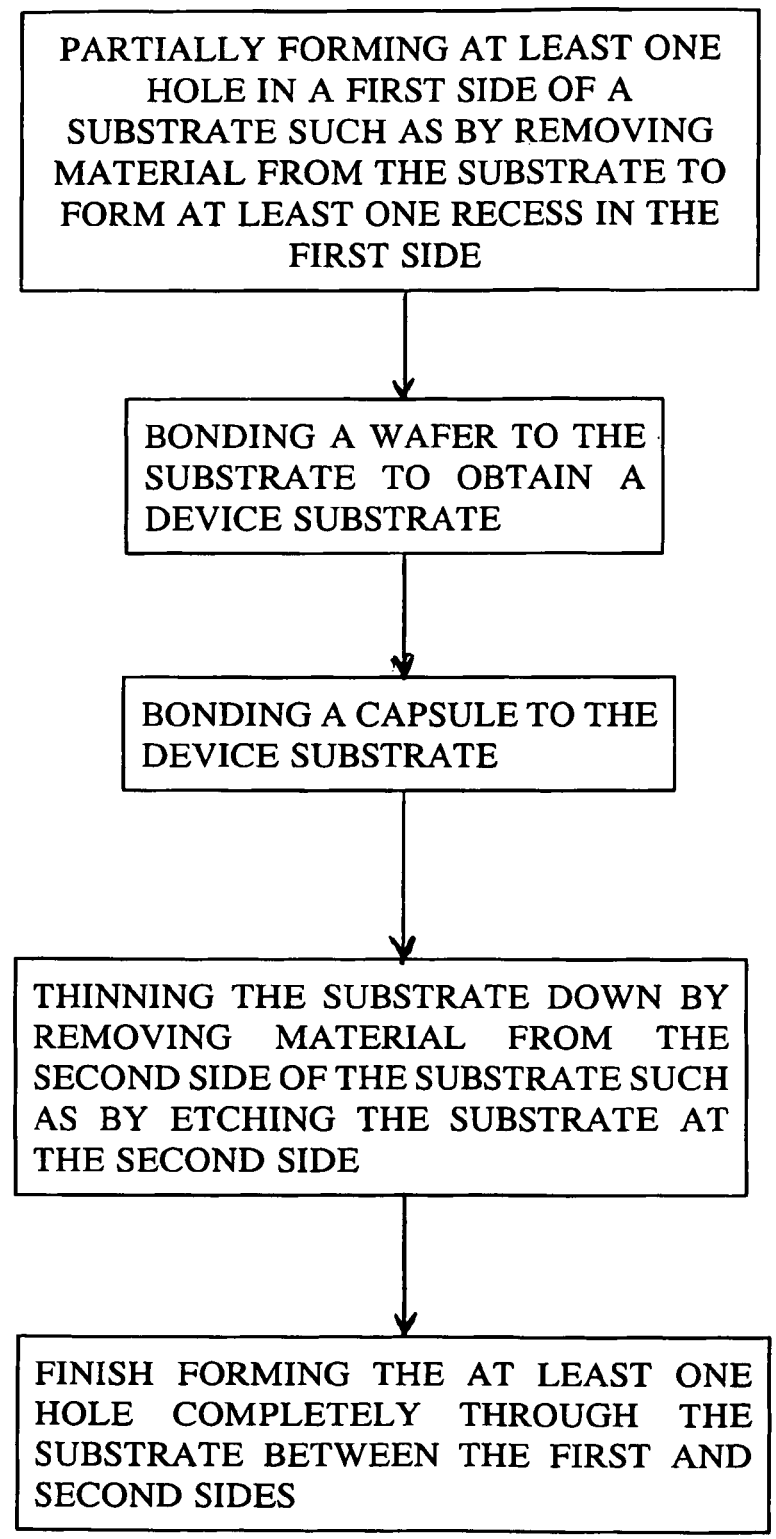
FIG. 3 is a block diagram flow chart illustrating steps for carrying out one embodiment of a method of the present invention.

In general the present invention relates to vacuum and/or hermetic packaging and feedthrough technology for micromachined or MEMS devices such as DWP sensors in general, and for vibratory gyroscopes, in particular. Two embodiments of the overall device structure of the package are shown in FIGS. 1 and 2. MEMS devices 22 are fabricated in a conventional fashion with p++ layers bonded to a glass substrate, and the electrical connections are formed by using metal lines on glass (typically a combination layer of Ti/Pt/Au is used with the gold being the top layer). The feedthroughs are substantially vertical and are formed through the glass substrate.

As shown in FIG. 1, a package capsule 10, typically made from either silicon (preferred) or glass, is bonded to a device glass substrate 12. Solder balls 14 and 16 may be formed on the bottom side of the glass substrate 12 and can take a number of different forms. It is also possible to not use solder balls at all, but instead use wire bonding 18 to metal lines 20 formed on the back side of the device glass substrate 12. Below, the process is described in more detail.

FIG. 1 illustrates not only one embodiment of the general structure of the package, but also shows a number of different options, as discussed below. Before this discussion, a detailed process sequence is presented. As stated above, MEMS devices 22 are preferably fabricated using the standard DWP process. A silicon wafer containing the MEMS is first bonded to the device glass substrate 12 and then dissolved away to free up the MEMS structures or devices 22. The glass substrate 12 is a substrate with standard thickness (usually in the range of 500–700 μm), or if possible it may be no more than 100 μm in thickness. However, an ultra-thin substrate may not be able to withstand the normal handling typically encountered in wafer processing. In any case, a standard thickness glass substrate will most likely be used. One can optionally form a shallow (~50 μm) recess 24 in the areas where the vertical feedthroughs are to be formed. The reason for forming these shallow recesses 24 is to simplify the formation of the rest of the feedthrough hole, generally indicated at 25, from the opposite side of glass substrate 12, as will become clear later. The recesses 24 can be formed by wet etching, sandblasting, or perhaps by DRIE etching.

After the recesses 24 are formed in the glass substrate 12 and the silicon wafer is bonded to the glass wafer or substrate 12 and dissolved away, the device substrate processing is complete, and the package capsule or wafer 10 can now be bonded to the device substrate 12. The bonding of the silicon cap or wafer 10 can be done using two ways: 1) the silicon cap 10 can be directly bonded to the glass substrate 12 using anodic bonding, as shown at 27 in FIG. 1; or 2) a silicon cap 10' can be bonded to a p++ rim, formed around the die when MEMS 22' are crated, using Si—Au eutectic bonding or using solder bonding, as shown in FIG. 2 at 27'. The latter approach may be better since one may be able to avoid the anodic bonding process, and thus minimize outgasing into the vacuum cavity.

At this point, one has a sandwich of two wafers, one is the silicon wafer 10 or 10' on top which forms the package (and is 500 µm thick if one assumes 4" wafers), and the other is the glass wafer 12 or 12', respectively, which supports the MEMS 22 or 22', respectively, and is about 700 µm thick (assuming one does not use a thin glass wafer).

There is a need to create the feedthrough holes 25 or 25' in the glass substrate 12 or 12', respectively, to form the vertical feeedthroughs. To do this, it is much easier if one had a thin glass substrate. However, as previously mentioned, the thick glass wafer can be thinned down from the backside. This can be done in a number of different ways: 1) chemical-mechanical polishing; or 2) simple wet etching. The latter technique works here because the entire front side of the wafer 12 or 12' is protected by the silicon cap 10 or 10', respectively, and therefore it is possible to leave the wafer combination in the glass etchant (typically HF acid) for a very long time until the glass substrate 12 or 12' is thinned to a thickness of about 100 µm. This is potentially the most straightforward and lowest-cost approach to glass thinning.

Once the glass wafer 12 or 12' is thinned, one can etch the rest of the feedthrough holes 25 or 25' through it using a number of different techniques: 1) by using photolithography and wet etching in HF/HNO$_3$ and/or by dry etching such as RIE; 2) by using sandblasting; 3) by using laser etching or by using any other method of removing the material. This region of the feedthrough hole 25 is indicated at 29 in FIG. 1.

Once the feedthrough hole 25 or 25' are completed, one now deposits a layer of gold to form the interconnect lines 20 or 20' on the back side of the wafer 12 or 12', respectively. This can be done using a simple shadow masking process since the feature sizes are large and since the glass substrate 12 or 12' has the deep holes 25 or 25', respectively, formed in it already. The thin layer of gold is then electroplated up to a thickness of about 10 µm to ensure that good step coverage is achieved and to provide additional coverage of the areas where the p++ silicon is bonded to the glass substrate 12 or 12' around the feedthrough holes 25 or 25', respectively. This electroplated gold layer 20 may be used as the base for forming solder balls 14 and 16, as shown in FIG. 1. A thin layer of Cr/Au may have to be deposited to allow electroplating by providing electrical connections at the perimeter of the wafer.

The solder balls 14 and 16 are then formed on the back side of the glass substrate or die 12. The solder ball 14 is formed inside one hole 25 and the solder ball 16 is formed on the surface of the glass substrate 12 on the perimeter where a bonding ring or area 27 is located. Forming the solder ball 16 on the perimeter outside of the hole 25 may have the added advantages of: 1) being formed in a region where there is sufficient mechanical support provided by the silicon cap wafer 10; and 2) not being in the hole 25 and thus avoiding long-term stability problems due to the thermal mismatch.

It is also possible to not use solder balls at all and simply use the wire bonding 18. In this latter case, the die is placed on a board on its backside, with the silicon cap 10 touching the substrate. This has the advantage of mechanically isolating the device from mechanical stresses induced by the board.

FIG. 2 also shows a Pirani gauge, generally indicated at 30, which includes a heater 32 formed on a membrane 34. Contact metal 36, in turn, is formed on the heater 32.

The wafer is now ready to be diced using a standard saw to separate the individual dice. This can be done easily since the wafer is mechanically strong (i.e., the silicon wafer 10 provides sufficient mechanical strength). This completes the process.

This vacuum packaging technology is superior to other approaches in many important ways. First, the MEMS parts 22 or 22' are protected during the entire process after they are released, so they cannot be damaged easily. Second, the feedthrough holes 25 and 25' are substantially vertical, so precious die area is not consumed as it is with respect to lateral feedthrough approaches. Third, solder balls 14 and 16 can be easily formed for surface mount applications. Fourth, the package has sufficient mechanical integrity to allow it to withstand handling. Fifth, all process steps are wafer level and involve only standard processing steps. Sixth, the packaging approach provides several alternatives at different steps, thus maximizing the chances of the package to work. And, finally, this process does not alter the fabrication process of the MEMS devices 22 and 22' and is done only after the MEMS 22 and 22' are fabricated.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for manufacturing a vacuum or hermetically packaged micromachined or MEMS device having at least one substantially vertical feedthrough, the method comprising:

providing a substrate having a first and second side;

partially forming at least one hole in the first side of the substrate;

providing a micromachined or MEMS device fabricated on a first side of a substrate and located within a vacuum or hermetic cavity;

removing material from the second side to thin the substrate before the step of forming the at least one hole; and forming a path of electrically conductive material connecting the micromachined or MEMS device and the second side of the substrate through the at least one hole to form the at least one substantially vertical feedthrough.

2. The method as claimed in claim 1, wherein the substrate is a glass substrate.

3. The method as claimed in claim 1, wherein vacuum or hermetic cavity is at least partially defined by a capsule connected to the substrate at a bonding area.

4. The method as claimed in claim 3, wherein the step of forming the path includes the step of depositing a layer of electrically conductive material on the second side of the substrate and in the at least one hole.

5. The method as claimed in claim 4, further comprising placing a solder ball or paste in the at least one hole on the layer of electrically conductive material.

6. The method as claimed in claim 4, further comprising bonding a wire to the layer of electrically conductive material.

7. The method as claimed in claim 4, wherein the layer is deposited in the bonding area on the second side and wherein the method further comprises placing a solder ball or paste on the layer of electrically conductive material at the bonding area.

8. The method as claimed in claim 3, wherein the capsule is anodically bonded at the bonding area.

9. The method as claimed in claim 3, wherein the capsule is eutectically or solder bonded at the bonding area.

10. The method as claimed in claim 1, wherein the micromachined or MEMS device includes at least one microstructure.

11. The method as claimed in claim 10, wherein the at least one microstructure includes a doped-semiconductor or metal microstructure.

12. The method as claimed in claim 1, further comprising forming a plurality of electrical leads on the first side of the substrate in communication with the micromachined or MEMS device.

13. The method as claimed in claim 1, wherein the step of providing a micromachined or MEMS device may include the step of bonding a capsule to the substrate to form the vacuum or hermetic cavity.

14. The method as claimed in claim 1, wherein the step of finish forming the at least one hole includes the step of etching the substrate at the second side of the substrate.

15. A method for manufacturing a vacuum or hermetically packaged micromachined or MEMS device, the method comprising:
provided a wafer and a substrate having first and second sides;
partially forming at least one hole in the first side of the substrate;
bonding the wafer to the substrate to obtain a device substrate after the step of partially forming;
fabricating a micromachined or MEMS device from the wafer after the step of bonding;
positioning a capsule having a concave surface on the device substrate over the micromachined or MEMS device;
bonding the capsule to the device substrate to form a vacuum or hermetic cavity enclosing the micromachined or MEMS device and to form a bonding area which provides a hermetic seal around the vacuum or hermetic cavity;
thinning the substrate down;
finish forming at least one hole completely through the substrate between the first and second sides after the step of thinning; and
forming a path of electrically conductive material connecting the micromachined or MEMS device and the second side of the substrate through the at least one hole.

16. The method as claimed in claim 15, wherein the substrate is a glass substrate.

17. The method as claimed in claim 15, wherein the capsule is a silicon or glass capsule.

18. The method as claimed in claim 15, wherein the micromachined or MEMS device includes at least one microstructure.

19. The method as claimed in claim 18, wherein the at least one microstructure includes a doped-semiconductor or metal microstructure.

20. The method as claimed in claim 15, further comprising forming a plurality of electrical leads on the first side of the substrate in communication with the micromachined or MEMS device.

21. The method as claimed in claim 15, wherein the step of partially forming the at least one hole includes the step of removing material from the substrate to form at least one recess in the first side of the substrate before the step of bonding the wafer to the substrate.

22. The method as claimed in claim 15, wherein the step of thinning includes the step of etching the substrate at the second side of the substrate after the step of bonding the capsule to the device substrate.

23. The method as claimed in claim 15, wherein the step of forming the path includes the step of depositing a layer of electrically conductive material on the second side of the substrate and in the at least one hole.

24. The method as claimed in claim 23, further comprising placing a solder ball or paste that can be heated to form a solder ball in the at least one hole on the layer of electrically conductive material.

25. The method as claimed in claim 23, further comprising bonding a wire to the layer of electrically conductive material.

26. The method as claimed in claim 23, wherein the layer is deposited at the bonding area on the second side and wherein the method further comprises placing a solder ball or paste on the layer of electrically conductive material at the bonding area.

27. The method as claimed in claim 15, wherein the step of thinning includes the step of removing material from the second side of the substrate to thin the substrate after the step of bonding the capsule to the device substrate and before the step of finish forming.

28. The method as claimed in claim 15, wherein the step of bonding the capsule to the device substrate includes the step of anodically bonding the capsule to the substrate.

29. The method as claimed in claim 15, wherein the step of bonding the capsule to the device substrate includes the step of eutectically or solder bonding the capsule to a peripheral portion of the semiconductor device to minimize outgasing into the vacuum or hermetic cavity.

30. A vacuum or hermetic packaged micromachined or MEMS device manufactured in accordance with the steps of claim 15.

31. The device as claimed in claim 30, wherein the substrate is a glass substrate.

32. The device as claimed in claim 30, wherein the capsule is a silicon or glass capsule.

33. The device as claimed in claim 30, wherein the micromachined or MEMS device includes at least one microstructure.

34. The device as claimed in claim 33, wherein the at least one micro structure includes a doped-semiconductor or metal microstructure.

35. The device as claimed in claim 30, further comprising a plurality of electrical leads on the first side of the substrate in communication with the micromachined or MEMS device.

36. The device as claimed in claim 30, wherein the path includes a layer of electrically conductive material in the second side of the device substrate and in the at least one hole.

37. The device as claimed in claim 36, further comprising a solder ball positioned in the at least one hole on the layer.

38. The device as claimed in claim 36, wherein the layer is deposited in the bonding area on the second side and wherein the device further comprises a solder ball positioned on the layer in the bonding area.

39. The device as claimed in claim 30 wherein the micromachined or MEMS device includes at least one MEMS device.

* * * * *

UNITED STATES PATENT AND TRADEMARK OFFICE
CERTIFICATE OF CORRECTION

PATENT NO.        : 7,098,117 B2
APPLICATION NO. : 10/688417
DATED             : August 29, 2006
INVENTOR(S)       : Khalil Najafi et al.

It is certified that error appears in the above-identified patent and that said Letters Patent is hereby corrected as shown below:

Column 6, Line 51, Claim 1:

Delete "before the step of forming the at least one hole; and"

and insert therefor -- finish forming the at least one hole completely through the substrate between the first and second sides of the substrate after the step of removing; and --

Signed and Sealed this

Twenty-sixth Day of December, 2006

JON W. DUDAS
*Director of the United States Patent and Trademark Office*